United States Patent [19]

Kato

[11] Patent Number: 5,214,604
[45] Date of Patent: May 25, 1993

[54] ELECTRICALLY PROGRAMMABLE READ ONLY MEMORY DEVICE WITH DUMMY MEMORY CELLS USED IN DIAGNOSTIC OPERATION ON DECODER UNITS

[75] Inventor: Yasushi Kato, Tokyo, Japan

[73] Assignee: NEC Corporation, Japan

[21] Appl. No.: 748,508

[22] Filed: Aug. 22, 1991

[30] Foreign Application Priority Data

Aug. 28, 1990 [JP] Japan .................................. 2-227281

[51] Int. Cl.[5] ........................................... G11C 13/00
[52] U.S. Cl. .................... 365/210; 365/201; 365/230.01
[58] Field of Search ........... 365/182, 201, 210, 189.01, 365/189.05, 230.01, 230.06

[56] References Cited

U.S. PATENT DOCUMENTS

4,953,127  8/1990  Nagahashi et al. ............ 365/189.05

Primary Examiner—Terrell W. Fears
Attorney, Agent, or Firm—Laff, Whitesel, Conte & Saret

[57] ABSTRACT

An electrically programmable read only memory device is equipped with a regular memory cell array associated with word lines and various peripheral units such as address decoding units for carrying out a usual mode of operation on the regular memory cell array, and dummy memory cells are coupled to the word lines at random for a testing operation on the address decoding units so as to find whether or not the address decoding units concurrently selects more than one row or column of the regular memory cells without rewriting data bits.

10 Claims, 4 Drawing Sheets

ELECTRICALLY PROGRAMMABLE READ ONLY MEMORY DEVICE WITH DUMMY MEMORY CELLS USED IN DIAGNOSTIC OPERATION ON DECODER UNITS

FIELD OF THE INVENTION

This invention relates to a semiconductor memory device and, more particularly, to an electrically programmable read only memory device with dummy memory cells used in a diagnostic operation on decoder units.

DESCRIPTION OF THE RELATED ART

Figure 1:
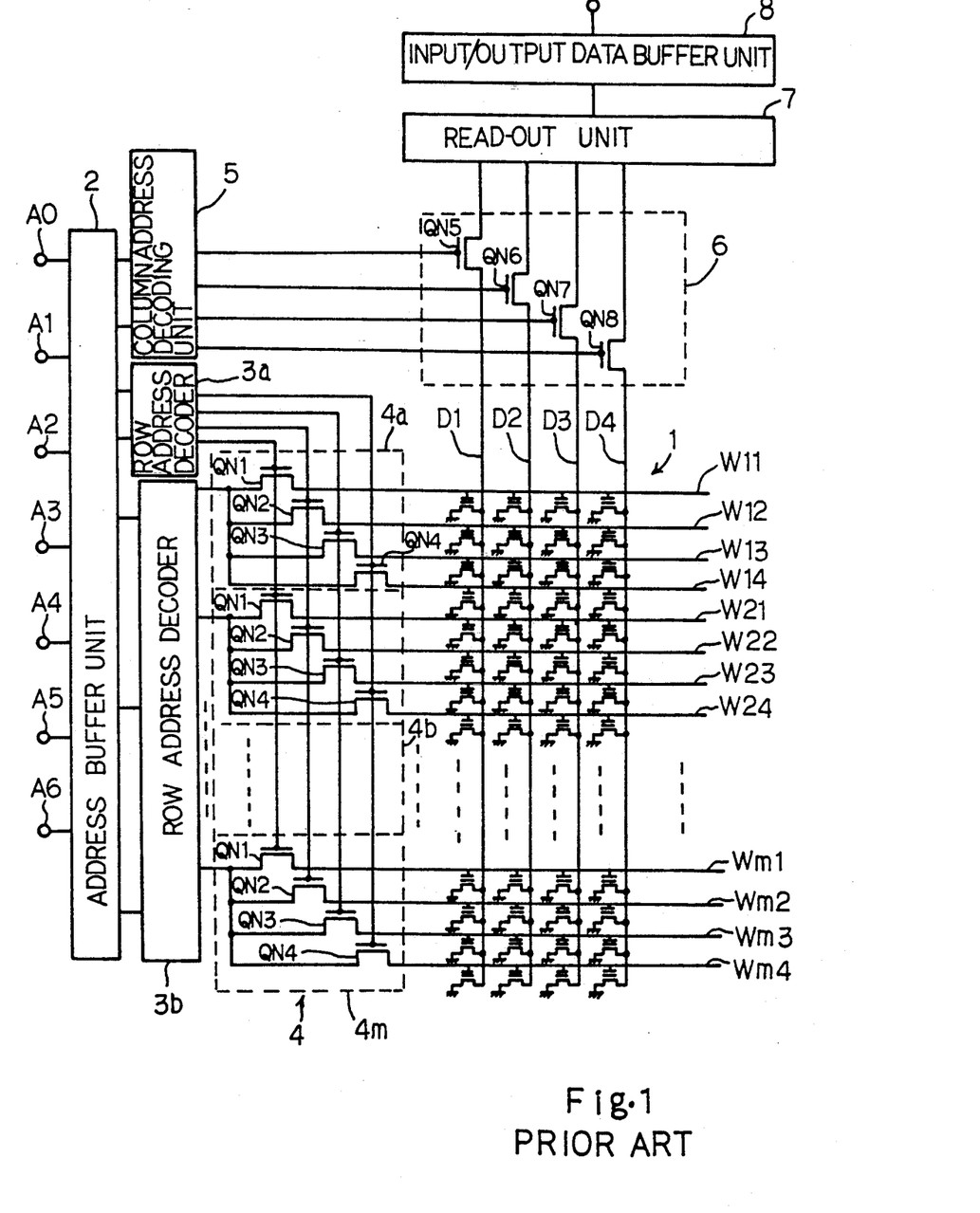
FIG. 1 is a circuit diagram showing the arrangement of the prior art electrically programmable read only memory device.

FIG. 1 shows a typical example of an electrically programmable read only memory device, and the electrically programmable read only memory device largely comprises a memory cell array 1, an address buffer unit 2, a row address decoders 3a and 3b, a row selecting unit 4, a column address decoding unit 5, a column selecting unit 6, a read out unit 7, and an input-/output data buffer unit 8. An address signal consisting of row address bits and column address bits is applied to address pins A0 to A6, and is temporally stored in the address buffer unit.

The memory cell array 1 is fabricated from a large number of programmable memory cells arranged in rows and columns, and the programmable memory cells are implemented by n-channel type floating gate field effect transistors. The rows of the programmable memory cells are respectively coupled to word lines W11 to W14, W21 to W24, . . . . and Wm1 to Wm4, and only one of the word lines W11 to Wm4 is selected by the row selecting unit 4 depending upon the row address bits decoded by the row address decoders 3a and 3b.

The columns of the programmable memory cells are associated with a plurality of digit lines D1 to D4, and the programmable memory cells are coupled between the associated digit lines D1 to D4 and a ground node. The digit lines D1 to D4 are coupled to the column selecting unit 6, and the column selecting unit 6 selectively couples the read-out unit 7 to the digit lines D1 to D4 depending upon the column address bits decoded by the column address decoding unit 5. The read-out unit 7 supplies current through the column selecting unit 6 to one of the digit lines D1 to D4, and decides the logic level of an accessed data bit depending upon the current flowing through the programmable memory cell into the ground node. The read-out unit 7 produces an output data signal and supplies the output data signal through the input/output data buffer unit to the outside thereof.

The row selecting unit 4 is constituted by row selectors 4a to 4m, and each of the row selectors 4a to 4m is implemented by four n-channel enhancement type field effect transistors QN1, QN2, QN3 and QN4. The plurality of word lines W11 to Wm4 are grouped by four, and every four word lines W11 to W14, W21 to W24 or Wm1 to Wm4 are coupled to one of the row selectors 4a to 4m. The n-channel enhancement type field effect transistors QN1 to QN4 are coupled in parallel between the row address decoder 3b and the associated word lines, and are gated by the row address decoder 3a. The column selecting unit 6 is implemented by four n-channel enhancement type field effect transistors QN5, QN6, QN7 and QN8, and the four n-channel enhancement type field effect transistors QN5 to QN8 are coupled between four digit lines D1 to D4 and the read-out unit 7. When one of the n-channel enhancement type field effect transistors QN5 TO QN8 turns on, the associated digit line is conducted to the read-out unit 7. Though not shown in FIG. 1, an extremely high voltage source is associated with the read-out unit 7, the row address decoders 3a and 3b, the column address decoding unit 5 for writing a data bit into one of the programmable memory cells.

The electrically programmable read only memory device thus arranged selectively enters an erasing phase, a programming phase and a read-out phase of operation. In the erasing phase of operation, the programmable memory cells are exposed to ultra-violet light, and all of the data bits are concurrently erased from the programmable memory cells.

If the electrically programmable read only memory device enters the programming phase of operation, one of the digit lines D1 to D4 goes up to the extremely high voltage level, and the p-n junctions at the drain nodes of the programmable memory cells coupled thereto are reversely biased so that hot electrons take place. One of the word lines W11 to Wm4 is also elevated to the extremely high voltage level, and the hot electrons are injected into the floating gate electrode of the programmable memory cell coupled to the selected digit line as well as to the selected word line. When the hot electrons are accumulated in the floating gate electrode, the programmable memory cell is increased in threshold level, and, for this reason, hardly turns on with a read-out signal on the associated word line. However, if any hot electron is accumulated in the floating gate electrode, the read-out voltage level allows the programmable memory cell to turn on to provide a conduction channel between the associated digit line and the ground node.

In the read-out phase of operation, the address signal stored in the address buffer unit 2 is decoded by the row address decoders 3a and 3b and the column address decoding unit 5. The row address decoder 3b selects one of the row selectors 4a to 4m, and supplies the read-out signal thereto. The row address decoder 3a allows one of the n-channel enhancement type field effect transistors QN1 to QN4 of the selected row selector to turn on so that the read-out signal is propagated to one of the word lines W11 to Wm4. On the other hand, the column address decoding unit 5 causes one of the n-channel enhancement type field effect transistors QN5 to QN8 to turn on, and the read-out unit 7 supplies current to the selected digit line. If the programmable memory cell coupled to the selected word line and the selected digit line remains erased, a conductive channel takes place therein, and the current flows into the ground node. However, if the electrons are injected to the floating gate electrode, no conductive channel takes place, and the selected programmable memory cell blocks the ground node from current. In other words, the voltage level in the read-out unit 7 have either high or low voltage level depending upon the state of the selected programmable memory cell, and the output data signal indicative of the state is supplied through the input-output buffer unit 8.

The electrically programmable read only memory device is subjected to a testing operation before delivery from a manufacturing facility. In the testing operation, not only the programmable memory cells but also other peripheral units such as the row address decoders are subjected to diagnosis to see whether or not the electrically programmable read only memory device has a defect.

In order to check the row address decoders 3a and 3b, the programmable memory cells are caused to alternately enter the write-in state, and the address signal sequentially selects the word lines W11 to Wm4. If the output data signal is indicative of the state of the memory cells sequentially selected by the word lines W11 to Wm4, the row address decoders 3a and 3b are excellent. However, if the output data signal is indicative of unexpected state, there is a trouble in the row address decoders 3a and 3b. Assuming now that the programmable memory cells coupled to the digit line D1 and the word lines W11, W21 and Wm1 are in the write-in state, the address signal indicative of the programmable memory cell coupled to the digit line D1 and the word line W11 is expected to result in the output data signal indicative of the write-in state. However, even if the row address decoder 3b has a trouble and concurrently designates the word lines W11 and W21, no current flows from the digit line D1 to the ground node, and the output data signal is indicative of the write-in state regardless of the double selection. Such a double selection may be overcome by repetition with different data bit pattern, however, the repetition consumes a large amount of time, and is, therefore, undesirable.

Thus, the prior art electrically programmable read only memory device encounters a problem in reliability of testing operation on the address decoders or in a prolonged testing operation.

SUMMARY OF THE INVENTION

It is therefore an important object of the present invention to provide an electrically programmable read only memory device which enhances the reliability of testing operation without sacrifice of time period.

To accomplish these objects, the present invention proposes to provide dummy memory cells arranged at random for a testing operation on decoder units.

In accordance with one aspect of the present invention, there is provided an electrically programmable read only memory device fabricated on a single semiconductor chip and having at least a testing mode and a usual mode of operation, comprising: a) a plurality of regular non-volatile memory cells storing data bits in a rewriteable manner, respectively, and arranged in rows and columns, the plurality of regular non-volatile memory cells being divided into a plurality of memory cell groups; b) a plurality of word lines respectively coupled to the rows of the plurality of regular non-volatile memory cells and selectively shifted to an active level, the plurality of word lines being divided into a plurality of word line groups respectively associated with the plurality of memory cell groups; c) an output data means for producing an output data signal; d) a plurality of digit lines coupled to the columns of the plurality of regular non-volatile memory cells, respectively, each of the plurality of digit lines propagating a data bit read-out from one of the plurality of regular non-volatile memory cells coupled to one of the word lines shifted to the active level toward the output data means; e) a row selecting means coupled to the plurality of word lines and shifting one of the word lines to the active level in both testing and usual modes of operation under an excellent condition; f) at least one column of dummy memory cells selectively coupled to the plurality of word lines and storing testing data bits, the at least one column of dummy memory cells being divided into a plurality of dummy memory cell groups respectively associated with the word line groups, the combination of the word lines coupled to the dummy memory cells of one of the dummy memory cell groups being different from the combination of the word lines coupled to the dummy memory cells of another dummy memory cell group; g) at least one dummy digit line coupled to the at least one column of the dummy memory cells for propagating one of the testing data bits toward the output data means; h) a column selecting means for coupling one of the digit lines to the output data means in the usual mode of operation; and i) a transferring means for coupling the at least one dummy digit line to the output data means in the testing mode of operation.

In accordance with another aspect of the present invention, there is provided an electrically programmable read only memory device fabricated on a single semiconductor chip and having at least a testing mode and a usual mode of operation, comprising: a) a plurality of regular non-volatile memory cells storing data bits in a rewriteable manner, respectively, and arranged in rows and columns, the plurality of regular non-volatile memory cells being divided into a plurality of memory cell groups; b) a plurality of word lines respectively coupled to the rows of the plurality of regular non-volatile memory cells and selectively shifted to an active level, the plurality of word lines being divided into a plurality of word line groups respectively associated with the plurality of memory cell groups; c) an output data means for producing an output data signal; d) a plurality of digit lines coupled to the columns of the plurality of regular non-volatile memory cells, respectively, each of the plurality of digit lines propagating a data bit read-out from one of the plurality of regular non-volatile memory cells coupled to one of the word lines shifted to the active level toward the output data means; e) a row selecting means coupled to the plurality of word lines and shifting one of the word lines to the active level in both testing and usual modes of operation under an excellent condition; f) a plurality of columns of dummy memory cells selectively coupled to the plurality of word lines and storing testing data bits, each column of dummy memory cells being divided into a plurality of dummy memory cell groups respectively associated with the word line groups, the combination of the word lines coupled to the dummy memory cells of a plurality of dummy memory cell groups associated with one of the word line groups being different from the combination of the word lines coupled to the dummy memory cells of another plurality of dummy memory cell groups associated with another word line group; g) a plurality of dummy digit lines coupled to the plurality of columns of the dummy memory cells for propagating the testing data bits toward the output data means; h) a column selecting means for coupling one of the digit lines to the output data means in the usual mode of operation; and i) a transferring means for coupling the plurality of dummy digit lines to the output data means in the testing mode of operation.

In accordance with yet another aspect of the present invention, there is provided an electrically programmable read Only memory device fabricated on a single semiconductor chip and having at least a testing mode and a usual mode of operation, comprising: a) a plurality of regular non-volatile memory cells arranged in rows and columns and respectively storing data bits in a rewriteable manner; b) a plurality of word lines coupled to the rows of the regular non-volatile memory cells, respectively, and selectively shifted to an active level; c) a plurality of digit lines coupled to the columns of the regular nonvolatile memory cells and divided into a plurality of digit line groups; d) a row selecting means shifting one of the word lines to the active level in the usual mode of operation and allowing the data bits to be read out from the regular non-volatile memory cells coupled to the aforesaid one of the word lines to the plurality of the digit lines; e) a data output means for producing an output data signal; f) a column selecting means interconnecting one of the plurality of digit lines to the data output means in an excellent state; g) a plurality of dummy memory cells divided into a plurality of dummy memory cell groups respectively associated with the plurality of digit line groups, the combination of the digit lines coupled to the dummy memory cells associated with one of the digit line groups being different from the combination of the digit lines coupled to the dummy memory cells associated with another digit line group; and h) a dummy word line coupled to the plurality of dummy memory cells for allowing the testing data bits to be read out to the digit lines coupled thereto in the testing mode of operation.

BRIEF DESCRIPTION OF THE DRAWINGS

The features and advantages of the electrically programmable read only memory device according to the present invention will be more clearly understood from the following description taken in conjunction with the accompanying drawings in which.

DESCRIPTION OF THE PREFERRED EMBODIMENTS

First Embodiment

Figure 2:
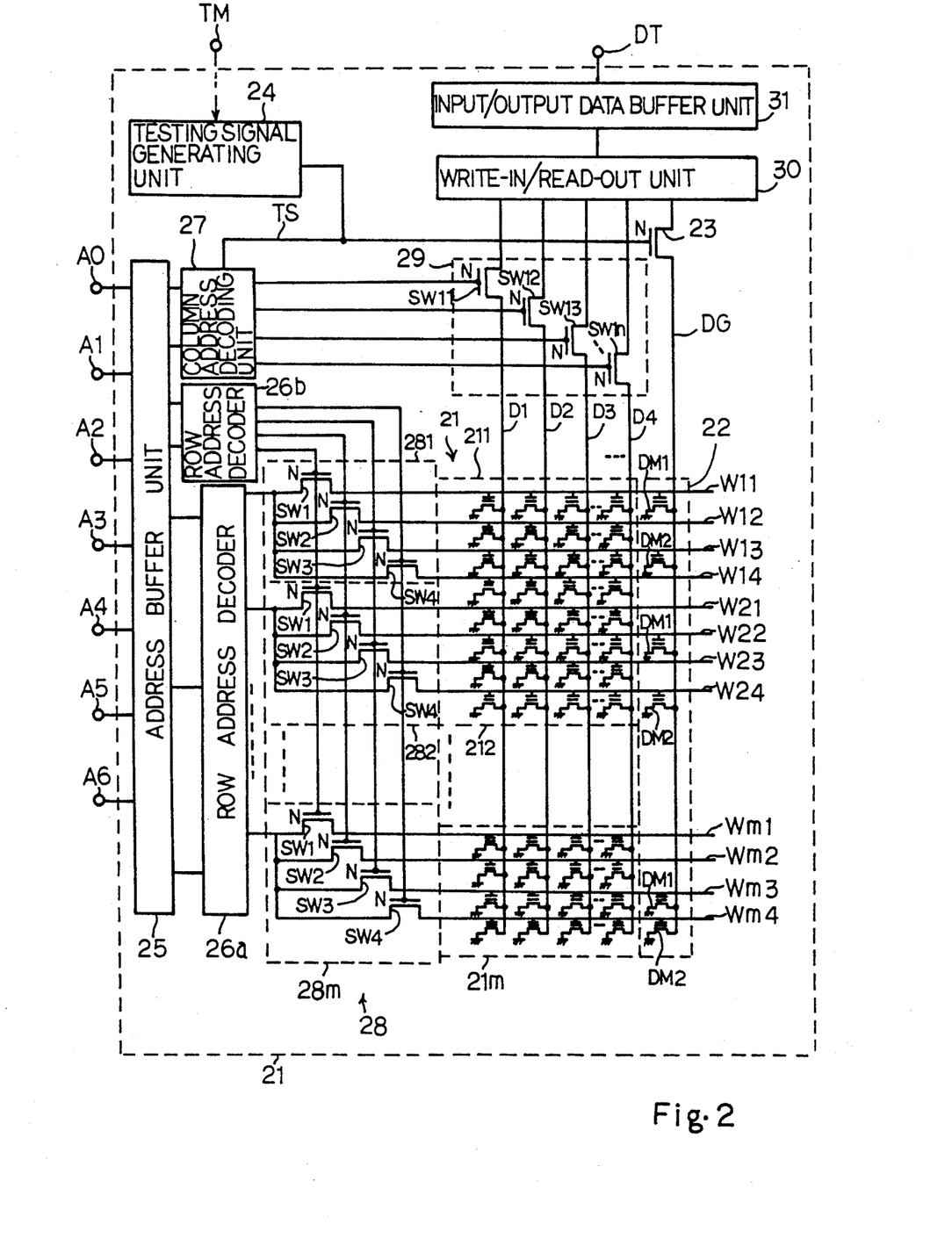
FIG. 2 is a circuit diagram showing the arrangement of an electrically programmable read only memory device according to the present invention.

Referring first to FIG. 2 of the drawings, an electrically programmable read only memory device embodying the present invention is fabricated on a single silicon chip 21, and largely comprises a memory cell array 21, various peripheral units for carrying out a usual mode of operation on the memory cell array 21, a column of dummy memory cells 22, an n-channel enhancement type transferring transistor 23 coupled to the column of dummy memory cells 22, and a testing signal generating unit 24. The memory cell array 21 consists of a plurality of memory cell groups 211, 212, . . . and 21m, and is implemented by a plurality of regular memory cells arranged in rows and columns. In this instance, the regular memory cells are implemented by n-channel floating gate enhancement type field effect transistors, and a data bit is memorized in each of the regular memory cells in the form of electrons accumulated in the floating gate electrode. The memory cell array 21 is associated with a plurality of word lines W11 to W14, W21 to W24, . . . and Wm1 to Wm4 and by a plurality of digit lines D1, D2, D3, . . . and Dn. The plurality of word lines W11 to Wm4 are grouped into word line groups which are respectively associated with the memory cell groups 211 to 21m. Each of the word lines W11 to Wm4 is coupled to the controlling gate electrodes of the regular memory cells in one of the rows, and the regular memory cells are coupled between the associated digit lines D1 to Dn to a ground voltage line.

The various peripheral units include an address buffer unit 25 coupled to address pins A0, A1, A2, A3, A4, A5 and A6 for temporally storing an address signal consisting of row address bits and column address bits, row address decoders 26a and 26b for decoding the row address bits, a column address decoding unit 27 for decoding the column address bits, a row selecting unit 28 coupled between the row address decoder 26a and the plurality of word lines W11 to Wm4 and controlled by the row address decoder 26b, a column selecting unit 29 coupled to the plurality of digit lines D1 to Dn and controlled by the column decoding unit 27, a write-in/read-out unit 30 coupled to the column selecting unit 29 as well as to the n-channel enhancement type transferring transistor 23, an input/output data buffer unit 31 coupled between the write-in/read-out unit 30 and an input/output data pin DT, and a testing signal generating unit operative to prohibit the column address decoding unit 27 from responding the column address bits and to gate the n-channel enhancement type transferring transistor 23. Though not shown in FIG. 2, sources of the ground voltage level, a read-out voltage level and an extremely high write-in voltage level are provided for the above mentioned peripheral units. The write-in/read-out unit 30 and the input/output data buffer unit 31 as a whole constitute an output data means, and the address buffer unit, the row address decoders 26a and 26b and the row selecting unit 28 form in combination a row selecting means. The address buffer unit 25, the column address decoding unit 27 and the column selecting unit 29 as a whole constitute a column selector means, and the n-channel enhancement type transferring transistor 23 serves as a transferring means.

The row selecting unit 28 has a plurality of row selecting circuits 281, 282, . . . and 28m respectively associated with the word line groups and, accordingly, with the memory cell groups 211 to 21m, and each of the row selecting circuits 281 to 28m is coupled between one of the output nodes of the row address decoder 26a and the associated word line group. Namely, each of the row selecting circuits 281 to 28m is implemented by a plurality of n-channel enhancement type switching transistors SW1, SW2, SW3 and SW4 coupled between the associated output node of the row address decoder 26a and the word lines of the associated word line group. The n-channel enhancement type switching transistors SW1 to SW4 are gated by the row address decoder 26b, and the row address decoder 26b selects one of the n-channel enhancement type switching transistors SW1 to SW4 from each of the row selecting circuits 281 to 28m. The row address decoder 26a also selects one of the output nodes and, accordingly, one of the row selecting circuits 281 to 28m, and, for this reason, the row address decoders 26a and 26b allow one of the word lines W11 to Wm4 to elevate either read-out or extremely high write-in voltage level on the basis of the address indicated by the row address bits.

The column selecting unit 29 is implemented by a plurality of n-channel enhancement type switching transistors SW11, SW12, SW13, . . . and SW1n coupled in parallel between the digit lines D1 to Dn and the write-in/read-out unit 30. The column address decoding unit 27 decodes the column address bits, and allows one of the n-channel enhancement type switching transistors SW11 to SW1n to turn on in a usual mode of operation. However, while the electrically programmable read only memory device remains in a testing mode of operation, the column address decoding unit 27 is never responsive to the column address bits in the presence of a testing signal TS produced by the testing signal generating unit 24, and all of the n-channel enhancement type switching transistors SW11 to SW1n remain off. In the testing mode of operation, a testing pin TM is elevated to a predetermined voltage level, and the testing signal generating unit 24 allows the n-channel type transferring transistor 23 to turn on with the testing signal TS instead of the n-channel enhancement type switching transistors SW11 to SW1n.

The write-in/read-out unit 30 selectively supplies the read-out voltage level and the extremely high write-in voltage level to the digit lines D1 to Dn in the usual mode of operation, and the read-out voltage level to the column of dummy memory cells 22 in the testing mode of operation.

The dummy memory cells 22 are of the n-channel enhancement type floating gate field effect transistor without any electron injected into the floating gate electrodes thereof, and selectively provided between a dummy digit line DG and the ground node. In this instance, two dummy memory cells DM1 and DM2 are provided for every word line group, and the associated word lines are respectively coupled to the controlling gate electrodes of the dummy memory cells DM1 and DM2, respectively. However, the combination of the associated word lines is different between the word line groups. Namely the dummy memory cells DM1 and DM2 associated with the word line group W11 to W14 are coupled to the first and third word lines W11 and W13, respectively, and the dummy memory cells DM1 and DM2 associated with the word line group W21 to W24 are coupled to the second and fourth word lines W22 and W24. However, the third and fourth word lines Wm3 and Wm4 are coupled to the dummy memory cells DM1 and DM2 in the last word line group Wm1 to Wm4. In FIG. 2, the symbol of the enhancement type floating gate field effect transistor illustrates the locations of the dummy memory cells, and no symbol is provided at other location determined by one of the word lines W11 to Wm4 and the dummy digit line DG. However, floating gate field effect transistors isolated from the ground node may be provided at the other locations. The n-channel enhancement type floating gate field effect transistor allows current to flow from the dummy digit line DG to the ground node, and, for this reason, the a low or the ground voltage level on the dummy digit line DG is indicative of a testing data bit. The electrically programmable read only memory device thus arranged selectively enters the usual mode and the testing mode of operation depending upon the voltage level at the testing pin TM. The usual mode of the operation consists of an erasing phase, a write-in phase and a read-out phase, and only a read-out operation is carried out in the testing mode of operation. In the erasing phase, the memory cell array 21 is exposed to ultra-violet radiation, and all of the regular memory cells simultaneously enter an erased state where the regular memory cells never turn on in the presence of the read-out voltage level on the associated word lines W11 to Wm4. In the write-in phase, one of the word lines W11 to Wm4 and one of the digit lines D1 to D4 are elevated to the extremely high write-in voltage level, and the regular memory cell coupled to the elevated word line and the elevated digit line enters the write-in state where the regular memory cell provides a conduction channel from the associated digit line and the ground node in the presence of the read-out voltage level on the associated word line. The write-in/read-out unit 30 applies the read-out voltage level to one of the digit lines D1 to Dn in the read-out phase, and checks the digit line to see whether or not the read-out voltage level is decayed by the selected regular memory cell. If the read-out voltage level on the digit line is decayed, the selected memory cell is in the erased state. However, the digit line is kept constant, the selected regular memory cell is in the write-in state, because no conductive channel takes place therein.

If the predetermined voltage level is applied to the testing pin TM, the testing signal generating unit 24 produces the testing signal TS, and the testing signal TS of the active high voltage level is distributed to the column address decoding unit 27 as well as to the n-channel enhancement type transferring transistor 23. The address signal sequentially designates the word lines W11 to Wm4, and the testing signal TS keeps the n-channel enhancement type switching transistors SW11 to SW1n off. For this reason, the read-out voltage level is not supplied through the column selecting unit 29 to any one of the digit lines D1 to Dn. However, the read-out voltage level is supplied through the n-channel enhancement type transferring transistor 23 to the dummy digit line DG. If the designated word line is coupled to a dummy memory cell, the read-out voltage level is decayed, because the dummy memory cell is implemented by the n-channel enhancement type floating gate field effect transistor. However, no current flows into the ground node when no enhancement type dummy memory cell is coupled to the designated word line. Thus, the write-in/read-out unit 30 can determine the designated word line by watching the voltage level on the dummy word line DG. Assuming now that the row address decoder 26a is not excellent and concurrently selects the row selecting circuits 281 and 282 upon designating the row selecting circuit 282, the row address decoder 26b causes two n-channel enhancement type switching transistors labeled with the same symbol, i.e., SW1, SW2, SW3 or SW4, to concurrently turn on in the testing mode of operation, and two word lines are simultaneously elevated to the read-out voltage level. The first word lines W11 and W21 are assumed to simultaneously go up to the read-out voltage level, and the dummy memory cell coupled to the word line W11 causes the read-out voltage level on the dummy digit line to be decayed. Since the designated word line W21 is not associated with any dummy memory cell, the decay on the dummy digit line DG informs us of the trouble of the row address decoder 26a.

Thus, the dummy memory cells 22 different in coupling pattern between the associated row selecting circuits 281 to 28n effectively find the trouble of the row address decoder 26a without any write-in operation. The dummy memory cells 22 also find a trouble of the row address decoder 26b without any write-in operation, and enhances the reliability of the testing operation.

Second Embodiment

Figure 3:
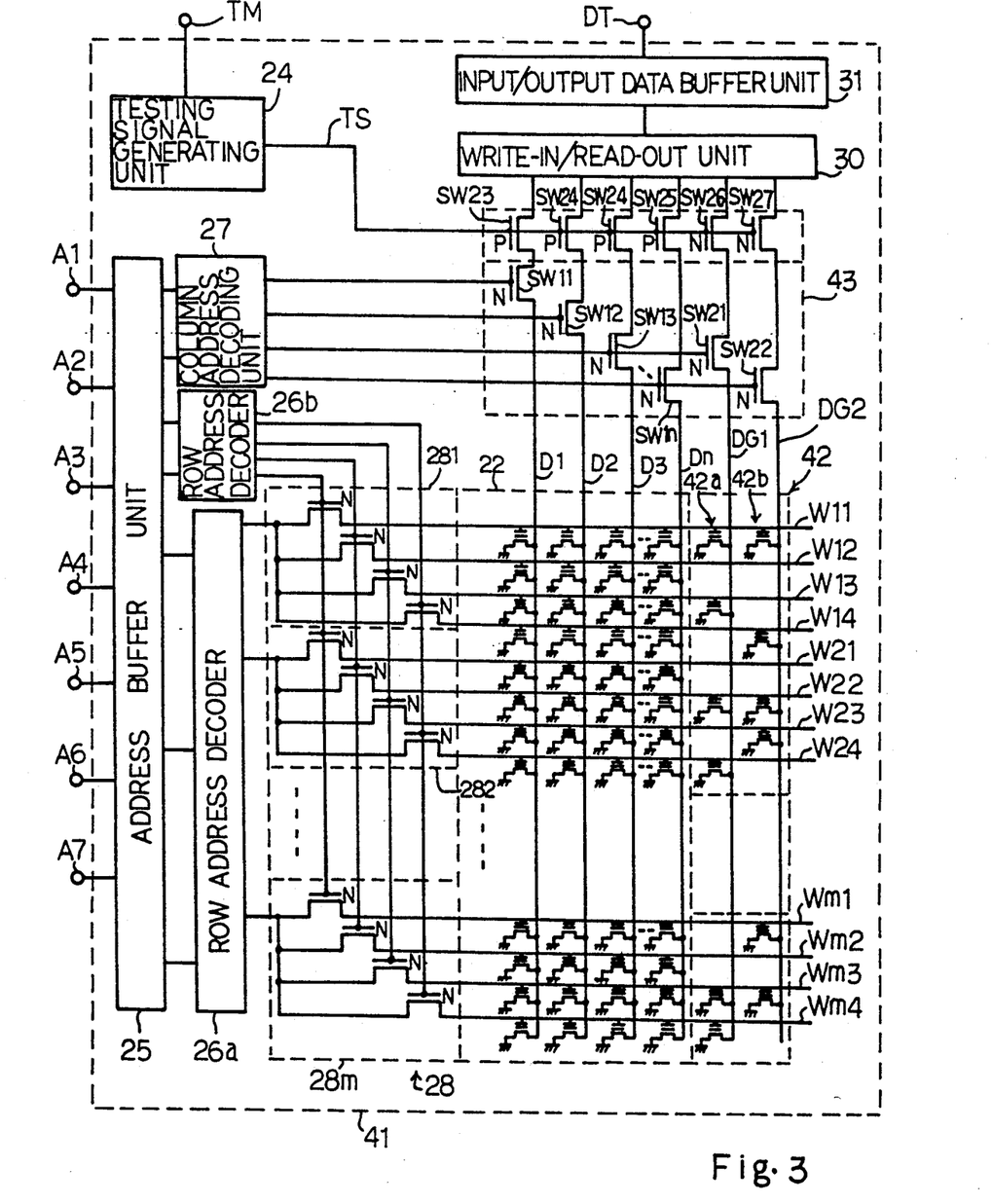
FIG. 3 is a circuit diagram showing the arrangement of another electrically programmable read only memory device according to the present invention.

Turning to FIG. 3 of the drawings, another electrically programmable read only memory device embodying the present invention is fabricated on a single semiconductor chip 41. The component units are similar to those of the electrically programmable read only memory device implementing the first embodiment except for a plurality of dummy memory cells 42 arranged in two columns and associated peripheral units, and, for this reason, the other component units of the second embodiment are designated by the same references used in FIG. 2 without detailed description.

The dummy memory cells 42 are selectively coupled to two dummy digit lines DG1 and DG2, and are, accordingly, arranged in two columns 42a and 42b. The dummy memory cells are implemented by n-channel enhancement type floating gate field effect transistors without any electron injected into the floating gate electrodes thereof, and enhancement type floating gate transistors isolated from the ground node may be respectively provided at the other locations designated by the word lines W11 to Wm4 and the dummy digit lines DG1 and DG2. Each of the columns 42a and 42b of the dummy memory cells 42 is divided into a plurality of dummy cell groups respectively associated with the word line groups W11 to W14, W21 to W24, . . . and Wm1 to Wm4, and the dummy cell groups associated with one of the word line groups W11 to W14, W21 to W24, . . . and Wm1 to Wm4 are different in pattern from the dummy cell groups associated with another word line groups. Namely, the dummy memory cells associated with the word line groups W11 to W14 are gated by the word lines W11, W13 and W14, and provide conduction channels from the first dummy digit lines DG1 and DG2 to the ground node. However, the dummy memory cells associated with the word line group W21 to W24 are gated by the word lines W22, W23 and W24, and interconnect the dummy digit lines DG1 and DG2 and the ground node. The word lines Wm1, Wm3 and Wm4 of the final word line group are coupled to the controlling gate electrodes of the dummy memory cells, and conduction channels take place between the dummy digit lines DG1 and DG2 and the ground node. Thus, the two columns of the dummy memory cells supply two testing data bits each high or low voltage level to the associated dummy bit lines DG1 and DG2 in a testing mode of operation.

In order to selectively couple the dummy digit lines DG1 and DG2 to the write-in/read-out unit 30, a column selecting unit comprises two n-channel enhancement type switching transistors SW21 and SW22 coupled to the dummy digit lines DG1 and DG2, and the n-channel enhancement type switching transistors SW21 and SW22 shear the decoding signal lines of the column address decoding unit 27 with the n-channel enhancement type switching transistors SW12 and SW13, respectively. Between the n-channel enhancement type switching transistors SW11 to SW1n and SW21 and SW22 and the write-in/read-out unit 30 are coupled p-channel enhancement type switching transistors SW23 to SW25 and n-channel enhancement type switching transistors SW26 and SW27 which are concurrently gated by the testing signal generating unit 24. In this instance, the n-channel enhancement type switching transistors SW21, SW22, SW26 and SW27 form in combination a transferring means, and the address buffer unit 25, the column address decoding unit 27, the n-channel enhancement type switching transistors SW11 to SW14 and the p-channel enhancement type switching transistors SW23 to SW25 as a whole constitute a column selecting means. In the usual mode of operation, the testing signal generating unit 24 shifts the testing signal to the low voltage level, and the p-channel enhancement type switching transistors SW23 to SW25 turn on, however, the n-channel enhancement type switching transistors SW26 and SW27 remain off. For this reason, the write-in/read-out unit 30 is connectable through the p-channel enhancement type switching transistors SW23 to SW25 and the n-channel enhancement type switching transistors SW11 to SW25 to the regular memory cell array 22 in the usual mode of operation. In the usual mode of operation, the electrically programmable read only memory device selectively enters the erasing phase, the write-in phase and read-out phase of operation. However, they are similar to those of the first embodiment, and detailed description is omitted for avoiding repetition.

In the testing mode of operation, the testing signal goes up to a high voltage level, and the p-channel enhancement type switching transistors SW23 to SW25 turn off, and the n-channel enhancement type switching transistors SW26 and SW27 turn on. Then, the write-in/read-out unit 30 is connectable through the n-channel enhancement type switching transistors SW26 and SW27 as well as either n-channel enhancement type switching transistor SW21 or SW22 to the dummy memory cells 42. The row address decoders 26a and 26b and the row selecting unit 28 behave as similar to those of the first embodiment. However, the testing signal generating unit 24 does not prohibit the column address decoding unit 27, and the column address decoding unit 27 selectively makes the n-channel enhancement type switching transistors SW21 and SW22 conductive depending upon the column address bits. Namely, the column address decoding unit 27 firstly allows the n-channel enhancement type switching transistor SW21 to turn on, by way of example, and the row address decoders 26a and 26b are subjected to diagnosis by using the dummy memory cells coupled to the dummy digit line DG1. Subsequently, the column address decoding unit 27 shifts the n-channel enhancement type switching transistor SW22 to the on-state, and the diagnosis is repeated with the dummy memory cells coupled to the dummy digit line DG2.

If the number of the word line groups W11 to W14, W21 to W24, . . . and Wm1 to Wm4 is increased together with the integration density, dummy memory cells may be coupled to the word lines assigned to the corresponding locations such as W11, W21 and Wm1, and a single dummy digit line hardly achieves highly reliable diagnosis. However, if the dummy digit lines are increased, the combinations of the dummy memory cells coupled to the word lines are different, and the testing operation with the plurality of dummy digit lines enhances the reliability of the electrically programmable read only memory device.

Third Embodiment

Figure 4:
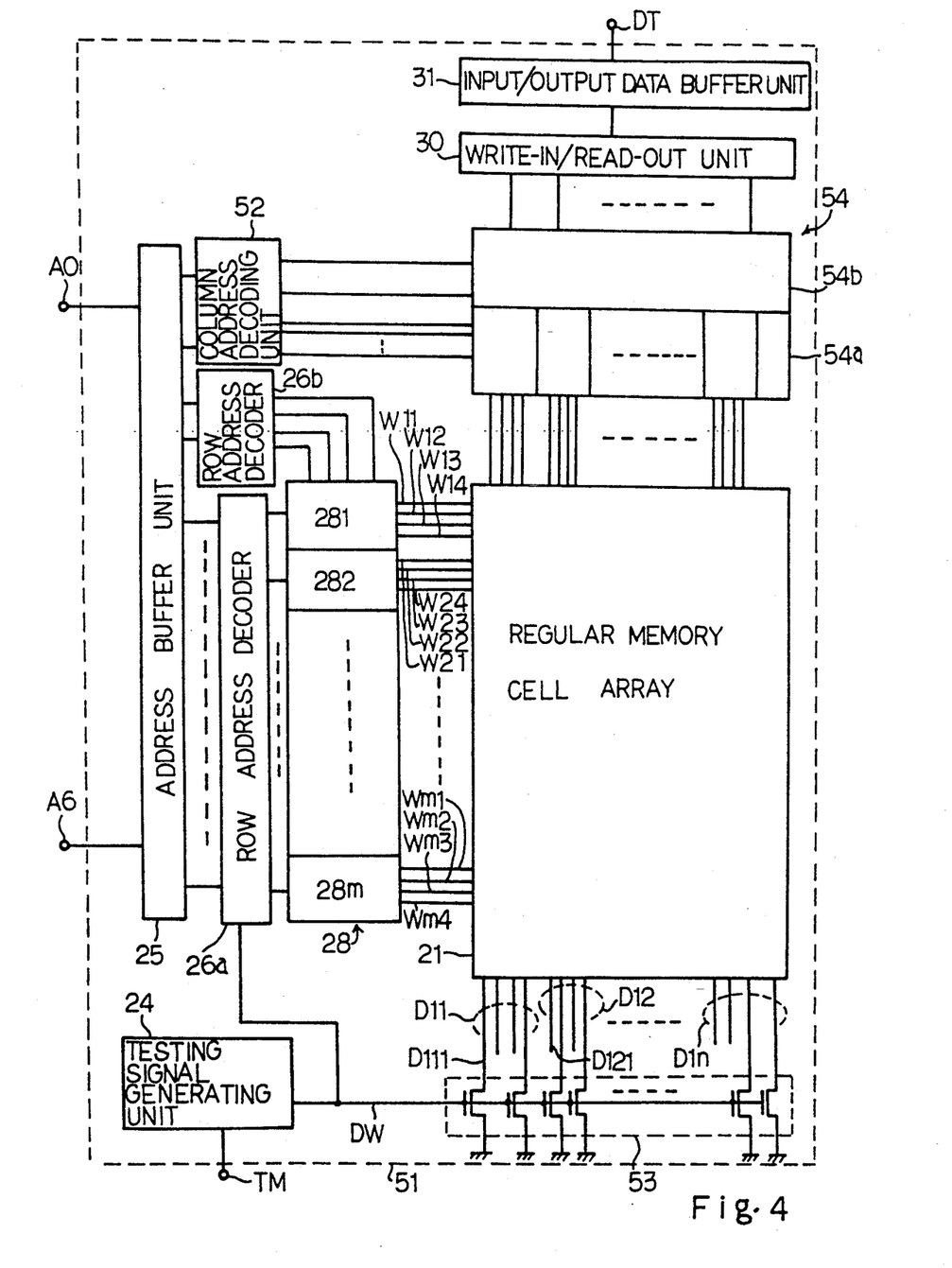
FIG. 4 is a block diagram showing the arrangement of yet another electrically programmable read only memory device according to the present invention.

Turning to FIG. 4 of the drawings, yet another electrically programmable read only memory device embodying the present invention is illustrated and fabricated on a single semiconductor chip 51. The diagnosis with dummy memory cell is applied to column address decoding unit 52, and components of the third embodiment corresponding to the first embodiment are labeled with the same references used in FIG. 2. The digit lines associated with the regular memory cell array 21 are grouped into a plurality of digit line groups D11, D12, .... and D1n, and dummy memory cells 53 arranged in a row are also grouped in association with the digit line groups D11 to D1n. The dummy memory cells are of the n-channel enhancement type floating gate field effect transistor without electron accumulated in the floating gate electrode, and are selectively coupled to the digit lines in a different pattern. Namely, the dummy memory cells are coupled to the first and fourth digit lines of the digit line group D11. However, the dummy memory cells are coupled to the second and fourth digit lines of the digit line group D12, and the third and fourth digit lines of the digit line group D1n are coupled to the dummy memory cells. The dummy memory cells 53 are concurrently gated by a dummy word line DW, and the dummy word line DW goes up to an active high voltage level in the testing mode of operation. The digit lines without any symbol of the floating gate field effect transistor may be coupled to n-channel floating gate type field effect transistors isolated from the ground node.

The column selecting unit 54 coupled to the digit lines is of the two-stage type, and is controlled by the column address decoding unit 52. Namely the first stage 54a of the column selecting unit 54 selects a digit line from every digit line group, and couples n digit lines to the second stage. The second stage 54b interconnects one of the n digit lines and the write-in/read-out unit 30 depending upon the decoding signal supplied from the column address decoding unit 52.

The electrically programmable read only memory device thus arranged selectively enters the usual mode and testing mode of operation. The usual mode of operation consists of the erasing phase, the write-in phase and the read-out phase of operation, and no further description is incorporated because of the similarity to the first embodiment.

In the testing mode of operation, testing signal generating unit 24 prohibits the row address decoders 26a and 26b from response to the row address bits, and any word line W11 to Wm4 is never elevated to the active high voltage level. However, all of the dummy memory cells 53 turn on with the testing signal of the high voltage level.

If the column address decoding unit is excellent, the write-in/read-out unit 30 produces an output data signal indicative of the voltage level on a selected digit line, and the voltage level on the selected digit line depends on the dummy memory cell coupled to or isolated from the ground node.

However, if there is a trouble in the column address decoding unit 52, multiple selection takes place. For example, when the column address bits designates the first digit line D121, the column address decoding unit 52 selects two digit lines D111 and D121, and the write-in/read-out unit 30 detects the low voltage level due to the current path through the dummy memory cell coupled to the digit line D111. If the column address decoding unit 26b is excellent, the high voltage level is expected, and the detected low voltage level teaches the trouble of the column address decoding unit 26b.

Although particular embodiments of the present invention have been shown and described, it will be obvious to those skilled in the art that various changes and modifications may be made without departing from the spirit and scope of the present invention. For example, the dummy memory cells may be provided for not only row address decoding unit but also column address decoding unit.

What is claimed is:

1. An electrically programmable read only memory device fabricated on a single semiconductor chip and having at least a testing mode and a usual mode of operation, comprising:
    a) a plurality of regular non-volatile memory cells storing data bits in a rewriteable manner, respectively, and arranged in rows and columns, said plurality of regular non-volatile memory cells being divided into a plurality of memory cell groups;
    b) a plurality of word lines respectively coupled to said rows of said plurality of regular non-volatile memory cells and selectively shifted to an active level, said plurality of word lines being divided into a plurality of word line groups respectively associated with said plurality of memory cell groups;
    c) an output data means for producing an output data signal;
    d) a plurality of digit lines coupled to said columns of said plurality of regular non-volatile memory cells, respectively, each of said plurality of digit lines propagating a data bit read-out from one of said plurality of regular non-volatile memory cells coupled to one of said word lines shifted to said active level toward said output data means;
    e) a row selecting means coupled to said plurality of word lines and shifting one of said word lines to said active level in both testing and usual modes of operation under an excellent condition;
    f) at least one column of dummy memory cells selectively coupled to said plurality of word lines and storing testing data bits, said at least one column of dummy memory cells being divided into a plurality of dummy memory cell groups respectively associated with said word line groups, the combination of said word lines coupled to said dummy memory cells of one of said dummy memory cell groups being different from the combination of said word lines coupled to said dummy memory cells of another dummy memory cell group;
    g) at least one dummy digit line coupled to said at least one column of said dummy memory cells for propagating one of said testing data bits toward said output data means;
    h) a column selecting means for coupling one of said digit lines to said output data means in said usual mode of operation; and
    i) a transferring means for coupling said at least one dummy digit line to said output data means in said testing mode of operation.

2. An electrically programmable read only memory device as set forth in claim 1, in which said plurality of regular non-volatile memory cells are implemented by floating gate type field effect transistors, respectively.

3. An electrically programmable read only memory device as set forth in claim 1, in which said column selecting means comprises a column address decoding unit for decoding column address bits, and a column selecting unit coupled between said plurality of digit lines and said output data means for interconnecting one of said plurality of digit lines and said output data means under the control of said column address decoding unit.

4. An electrically programmable read only memory device as set forth in claim 3, in which said electrically programmable read only memory device further comprises j) a testing signal generating unit for generating a testing signal for allowing said transferring means to interconnect said at least one dummy digit line to said output data means, said testing signal being further operative to deactivate said column address decoding unit.

5. An electrically programmable read only memory device as set forth in claim 4, in which said output data means comprises a read-out and write-in unit coupled to said column selecting unit and said transferring means, and an input and output data buffer unit coupled between said read-out and write-in unit and a data pin.

6. An electrically programmable read only memory device as set forth in claim 5, in which said transferring means is implemented by a first filed effect transistor coupled between said at least one dummy digit line and said column selecting unit, said testing signal being supplied to the gate electrode of said first field effect transistor.

7. An electrically programmable read only memory device as set forth in claim 1, in which said row selecting means comprises a plurality of row selecting circuits respectively coupled to said word line groups, a first row address decoder coupled to said plurality of row selecting circuits and operative to decode first row address bits for designating one of said row selecting circuits, and a second row address decoder coupled to said row selecting circuits and operative to decode second row address bits for allowing one of said word lines of said one of said row selecting circuits to go up to said active level.

8. An electrically programmable read only memory device as set forth in claim 7, in which each of said row selecting circuits has a plurality of second field effect transistors coupled in parallel between said first row address decoder and said word lines of said associated word line group, said second field effect transistors being selectively gated by said second row address decoder.

9. An electrically programmable read only memory device fabricated on a single semiconductor chip and having at least a testing mode and a usual mode of operation, comprising:
 a) a plurality of regular non-volatile memory cells storing data bits in a rewriteable manner, respectively, and arranged in rows and columns, said plurality of regular non-volatile memory cells being divided into a plurality of memory cell groups;
 b) a plurality of word lines respectively coupled to said rows of said plurality of regular non-volatile memory cells and selectively shifted to an active level, said plurality of word lines being divided into a plurality of word line groups respectively associated with said plurality of memory cell groups;
 c) an output data means for producing an output data signal;
 d) a plurality of digit lines coupled to said columns of said plurality of regular non-volatile memory cells, respectively, each of said plurality of digit lines propagating a data bit read-out from one of said plurality of regular non-volatile memory cells coupled to one of said word lines shifted to said active level toward said output data means;
 e) a row selecting means coupled to said plurality of word lines and shifting one of said word lines to said active level in both testing and usual modes of operation under an excellent condition;
 f) a plurality of columns of dummy memory cells selectively coupled to said plurality of word lines and storing testing data bits, each column of dummy memory cells being divided into a plurality of dummy memory cell groups respectively associated with said word line groups, the combination of said word lines coupled to said dummy memory cells of a plurality of dummy memory cell groups associated with one of said word line groups being different from the combination of said word lines coupled to said dummy memory cells of another plurality of dummy memory cell groups associated with another word line group;
 g) a plurality of dummy digit lines coupled to said plurality of columns of said dummy memory cells for propagating said testing data bits toward said output data means;
 h) a column selecting means for coupling one of said digit lines to said output data means in said usual mode of operation; and
 i) a transferring means for coupling said plurality of dummy digit lines to said output data means in said testing mode of operation.

10. An electrically programmable read only memory device fabricated on a single semiconductor chip and having at least a testing mode and a usual mode of operation, comprising:
 a) a plurality of regular non-volatile memory cells arranged in rows and columns and respectively storing data bits in a rewriteable manner;
 b) a plurality of word lines coupled to said rows of said regular non-volatile memory cells, respectively, and selectively shifted to an active level;
 c) a plurality of digit lines coupled to said columns of said regular non-volatile memory cells and divided into a plurality of digit line groups;
 d) a row selecting means shifting one of said word lines to said active level in said usual mode of operation and allowing said data bits to be read out from said regular non-volatile memory cells coupled to said one of said word lines to said plurality of said digit lines;
 e) a data output means for producing an output data signal;
 f) a column selecting means interconnecting one of said plurality of digit lines to said data output means in an excellent state;
 g) a plurality of dummy memory cells divided into a plurality of dummy memory cell groups respectively associated with said plurality of digit line groups, the combination of said digit lines coupled to said dummy memory cells associated with one of said digit line groups being different from the combination of said digit lines coupled to said dummy memory cells associated with another digit line group; and
 h) a dummy word line coupled to said plurality of dummy memory cells for allowing said testing data bits to be read out to said digit lines coupled thereto in said testing mode of operation.

* * * * *